United States Patent [19]

Satonaka

[11] 4,012,764
[45] Mar. 15, 1977

[54] SEMICONDUCTOR INTEGRATED CIRCUIT DEVICE

[75] Inventor: Koichiro Satonaka, Fuchu, Japan
[73] Assignee: Hitachi, Ltd., Japan
[22] Filed: Dec. 4, 1975
[21] Appl. No.: 637,575
[30] Foreign Application Priority Data
  Dec. 4, 1974   Japan ............................ 49-138411
[52] U.S. Cl. .................................. 357/68; 357/36; 357/46; 357/52
[51] Int. Cl.² .................. H01L 29/72; H01L 27/02; H01L 29/34; H01L 23/48
[58] Field of Search ................... 357/36, 46, 68, 52

[56] References Cited
UNITED STATES PATENTS

| 3,587,052 | 6/1971 | Metcalf | 357/36 |
| 3,593,068 | 7/1971 | Rosier | 357/36 |
| 3,631,307 | 12/1971 | Naugler | 357/36 |

*Primary Examiner*—Edward J. Wojciechowicz
*Attorney, Agent, or Firm*—Craig & Antonelli

[57] ABSTRACT

A semiconductor integrated circuit device comprises at least a transistor comprising a semiconductor substrate including at least a single collector region of a first conductivity type, a plurality of base regions of a second conductivity type formed in the collector region, and emitter regions of the first conductivity type respectively formed in the base regions of the second conductivity type. The second conductivity type base regions are electrically connected in common with one another and the first conductivity type emitter regions are electrically connected in common with one another. A multilayer interconnection structure is employed so that the density of integration of the semiconductor integrated circuit device is high.

1 Claim, 5 Drawing Figures

SEMICONDUCTOR INTEGRATED CIRCUIT DEVICE

FIELD OF THE INVENTION

This invention relates to a semiconductor integrated circuit device.

BACKGROUND OF THE INVENTION

In general, a power transistor in a semiconductor integrated circuit requires a large current. For this reason, as is illustrated in the circuit of FIG. 1, at least two transistors are assembled in a semiconductor substrate, which have the respective emitter electrodes, base electrodes and collector electrodes connected in common by interconnection layers, and they are used as if they were a single power transistor.

As is well known, a power transistor is a transistor which can withstand a high output, so that the structure inevitably becomes large in size. The width of the interconnection layer formed on the surface of the semiconductor substrate is consequently large.

The power transistor has electrodes extending on an emitter layer, a base layer and a collector layer as fully as possible and the edges of opposing electrodes are long in order to prevent the current crowding between adjacent electrodes on the emitter layer, base layer and collector layer so as to enable the power transistor to supply a larger output. This current crowding causes a secondary breakdown which leads to the destruction of the power transistor.

Accordingly, the area occupied by the interconnection layers is large in the semiconductor integrated circuit in which a power transistor fabricated by the use of a single-layer electrode interconnection technique is assembled as above.

Indeed, the area occupied by the interconnection layers is approximately twice as large as that of the regions in which the emitter layer, the base layer and the collector layer was formed.

A great hindrance to the enhancement of the density of integration of a semiconductor integrated circuit that, in addition to the large area of the power transistor itself, as described above, has been the formation of such interconnection layers, so the area becomes larger.

SUMMARY OF THE INVENTION

This invention has eliminated this disadvantage, and has as an objects the provision of a semiconductor integrated circuit whose density of integration is enhanced and a novel interconnectionn structure of emitter, base and collector electrodes which, in constructing a power transistor within a semiconductor integrated circuit, is effective to prevent the occurrence of the current crowding phenomenon leading to secondary breakdown destruction of the power transistor.

A fundamental construction of this invention for accomplishing these objects resides in a semiconductor integrated circuit device which comprises at least a transistor comprising a semiconductor substrate including at least a single collector region of a first conductivity type, a plurality of base regions of a second conductivity type formed in the collector region, and emitter regions of the first conductivity type respectively formed in the base regions of the second conductivity type, the plurality of second conductivity type base regions being electrically commonly connected with one another, and the plurality of first conductivity type emitter regions being electrically commonly connected with one another. A first layer of insulating film is formed on one principal surface of the semiconductor substrate, the first-layer film being formed with a plurality of emitter first-layer window opening portions for exposing the greater parts of surface portions of the plurality of emitter regions on the one principal surface of the semiconductor substrate, with a plurality of base first-layer window opening portions for exposing the greater parts of surface portions of the plurality of base regions, and with a plurality of collector first-layer window opening portions for exposing the plurality of places of a surface portion of that single collector region. A first electrode interconnection forms a plurality of emitter first electrode layers or a single such layer respectively or commonly held in ohmic contact with the plurality of emitter regions through the plurality of emitter first-layer window opening portions, a single base first electrode interconnection layer commonly held in ohmic contact with the plurality of base regions through the plurality of base first-layer window opening portions, and a plurality of collector first electrode layers respectively held in ohmic contact with the collector region in the plurality of collector first-layer window opening portions. A second layer of insulating film is formed on the first-layer insulating film and the first electrode interconnection layer, the second-layer insulating film being formed with at least a plurality of collector second-layer window opening portions for exposing at least parts of surface portions of the plurality of collector first electrode layers. A second electrode interconnection layer forms at least a single collector second electrode interconnection layer electrically commonly connected with the plurality of collector first electrode layers through said plurality of collector second-layer window opening portions.

DETAILED DESCRIPTION OF THE INVENTION

Figure 4:
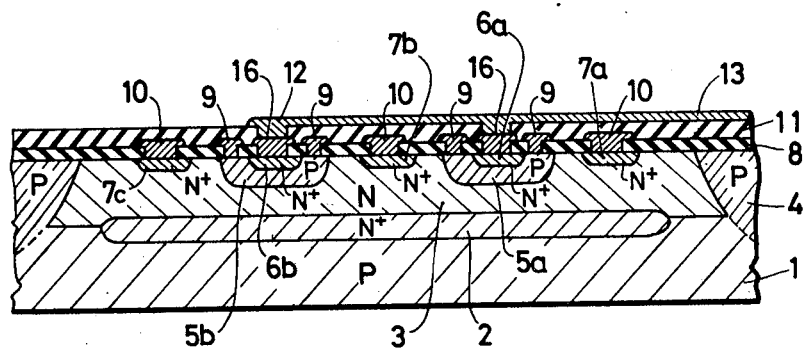
FIGS. 4 and 5 are a sectional view and a plan view, respectively, of the essential portions of a finished body of the semiconductor integrated circuit device according to the present invention.

FIG. 4 shows a sectional view of the essential portions of a finished product of a semiconductor integrated circuit device according to this invention. Referring to the figure, an $N^+$-type layer 2 is selectively formed on a P-type semiconductor substrate 1. On the P-type semiconductor substrate 1 and the $N^+$-type layer 2, an N-type layer 3 is formed by, for example, epitaxial growth. In order to electrically isolate the N-type layer overlying the $N^+$-type layer 2, a P-type layer 4, being an isolation layer, is formed around the $N^+$-type layer 2. P-type layers 5a and 5b to become base layers of power transistors are formed in the surface of the N-type layer 3 which is surrounded by the P-type layer 4. In regions of the surfaces of the P-type layers 5a and 5b, there are respectively formed $N^+$-type layers 6a and 6b to become emitter layers. In those regions in the surface of the N-type layers 3 which are other than the P-type layers 5a and 5b, there are also formed N+-type layers 7a, 7b and 7c. They become contact layers of the N-type layer 3 to serve as a collector layer. On the surface of the semiconductor substrate 1 formed with the various impurity layers in this manner, an oxide film 8 being an insulating layer is formed. The oxide film 8 is perforated at parts of its areas situated on the impurity layers except the P-type layer 4 serving as the isolation layer, and base electrodes 9 and collector electrodes 10 are formed. On the base electrodes 9 as well as the collector electrodes 10 and further on the oxide film 8, an oxide film 11 is formed. At those parts of areas of the oxide film 11 which overlie the N+-type layers 6a and 6b being the emitter layers, there are formed apertures through which emitter electrodes 16 are formed. The emitter electrodes 16 are connected by an interconnection layer 13.

Figure 5:
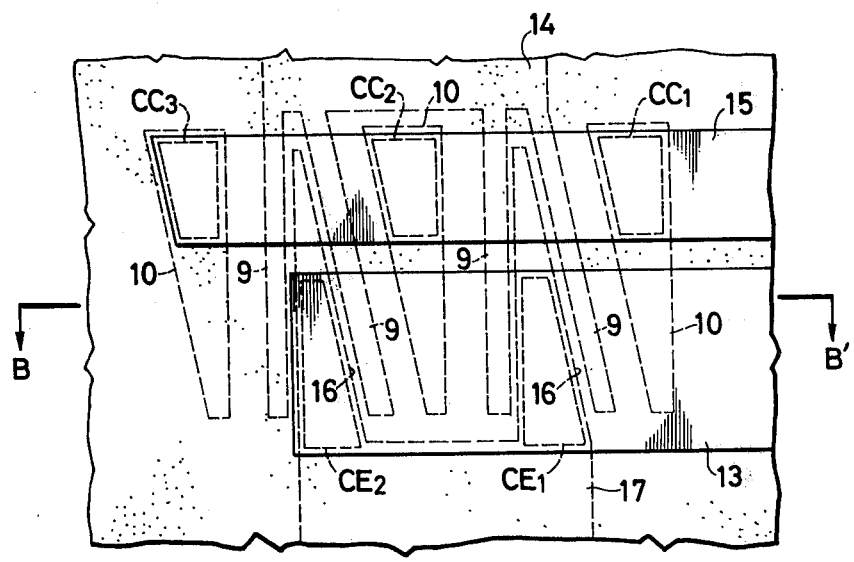

FIG. 5 is a plan view of the interconnection layer structure on the semiconductor substrate. The base electrodes 9 formed are collectively led out as an interconnection layer 14. The oxide film 11 is formed on the interconnection layer 14. On the oxide film 11, the interconnection layer 13 which is connected with the emitter electrodes 16 via through-holes $CE_1$ and $CE_2$ runs in a power transistor-forming region. In addition, an interconnection layer 15 which is connected with the collector electrodes 19 similarly via through-holes $CE_1$-$CE_3$ runs in the power transistor-forming region.

Figure 2:
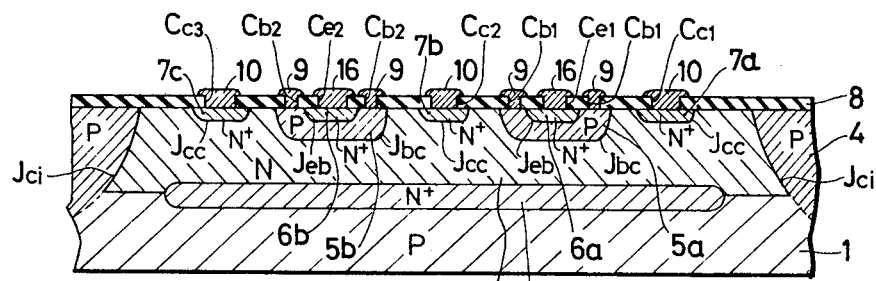
FIGS. 2 and 3 illustrate a sectional view and a plan view, respectively, of the essential portions of a structural body in the course of the manufacturing process of a semiconductor integrated circuit device according to the present invention.
Figure 3:
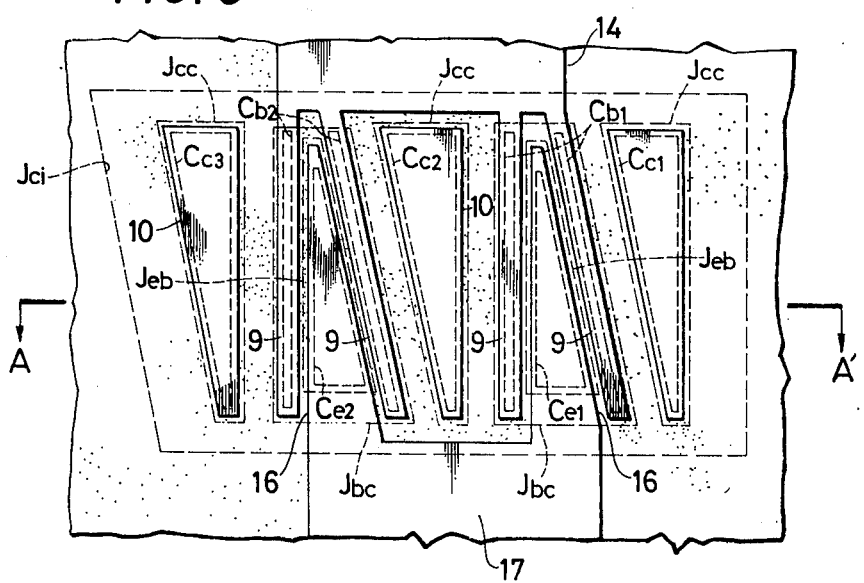

FIGS. 2 and 3 show a sectional view and a plan view of the essential portions of a structural body in the course of the manufacturing process of the semiconductor integrated circuit device according to this invention, respectively, in order to elucidate the construction of a first layer of insulator film and a first electrode interconnection layer in an embodiment of this invention. As is illustrated in FIG. 2, the first-layer insulating film 8 is formed on one principal surface of a semiconductor substrate. The first-layer insulating film 8 is formed with a plurality of emitter first-layer contact holes $C_{e1}$ and $C_{e2}$ for exposing the greater parts of the surface portions of a plurality of emitter regions 6a and 6b on the principal surface of the substrate, a plurality of base first-layer contact holes $C_{b1}$ and $C_{b2}$ for exposing the greater parts of the surface portions of a plurality of base regions 5a and 5b, and a plurality of collector first-layer contact holes $C_{c1}$, $C_{c2}$ and $C_{c3}$ for exposing the surface portions of a plurality of high impurity concentration regions 7a, 7b and 7c formed in a single collector layer 3. As is clearly seen in FIG. 3, a single emitter first electrode layer 16, a single base first electrode layer 9 and a plurality of collector first electrode layers 10 are formed by the first electrode interconnection layer. The single emitter first electrode layer 16 is held in ohmic contact commonly to the emitter regions 6a and 6b through the respective emitter first-layer contact holes $C_{e1}$ and $C_{e2}$. The single base first electrode layer 9 is held in ohmic contact commonly to the base regions 5a and 5b through the respective base first-layer contact holes $C_{b1}$ and $C_{b2}$. The plurality of collector first electrode layers 10 are respectively held in contact with the high impurity concentration regions 7a, 7b and 7c through the collector first-layer contact holes $C_{c1}$, $C_{c2}$ and $C_{c3}$.

In FIGS. 2 and 3, $J_{eb}$ denotes an emitter-base P-N junction, $J_{bc}$ a base-collector P-N junction, $J_{cc}$ a collector-high impurity concentration region junction, and $J_{ci}$ a collector-isolation region junction.

Further, as shown in FIG. 3, the greater parts of the surface portions of the respective emitter regions 6a and 6b are held in ohmic contact with the emitter first electrode layer 16 through the emitter first-layer contact holes $C_{e1}$ and $C_{e2}$, while the greater parts of the surface portions of the respective base regions 5a and 5b are held in ohmic contact with the base first electrode layer 9 through the base first-layer contact holes $C_{b1}$ and $C_{b2}$. Therefore, the current densities of currents flowing across the emitter-base P-N junctions $J_{eb}$ are substantially uniform in the respective emitter-base P-N junctions, and the current crowding phenomenon leading to the secondary breakdown destruction of a transistor is preventable.

Referring back to FIGS. 4 and 5, the second layer of insulating film 11 is formed on the first-layer insulating film 8 and the first electrode interconnection layer 9, 10, 16, 17, 14. The second-layer insulating film 11 is formed with collector second-layer contact holes $CC_1$, $CC_2$ and $CC_3$ for exposing at least parts of the surface portions of the plurality of collector first electrode layers 10, and emitter second-layer contact holes $CE_1$ and $CE_2$ for exposing at least parts of the surface portion of the emitter first electrode layer 16. By a second electrode interconnection layer, there are formed the single collector second electrode interconnection layer 15 and the emitter second electrode interconnection layer 13. The single collector second electrode interconnection layer 15 is electrically connected commonly to the plurality of collector first electrode layers through the respective collector second-layer contact holes $CC_1$, $CC_2$ and $CC_3$. The emitter second electrode interconnection layer 13 is electrically connected to the emitter first electrode layer 16 through the emitter second-layer contact holes $CE_1$ and $CE_2$.

In this manner, the plurality of high impurity concentration regions 7a, 7b and 7c are formed around the plurality of base regions 5a and 5b and have the collector electrodes 10 connected therewith, so that the resistance value $r_{cs}$ of the collector series resistance is decreased.

Figure 1:
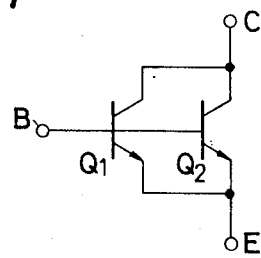
FIG. 1 shows an equivalent circuit of a power transistor as constructed within a semiconductor integrated circuit.

According to the embodiment of this invention as described above, a plurality of emitter first electrode layers 16 are electrically commonly connected by the emitter first interconnection layer 17 and the emitter second interconnection layer 13, while a plurality of base first electrode layers 9 are electrically commonly connected by the base first interconnection layer 14. It is therefore possible to obtain a transistor for power with emitters, bases and collectors connected in common as illustrated in the equivalent circuit of FIG. 1.

Although, in the foregoing embodiment of this invention, the common connection of the emitter electrodes is effected by the first electrode interconnection layer and the second electrode interconnection layer, the invention is not restricted thereto. The common connection of the emitter electrodes may be effected by either the first electrode interconnection layer or the second electrode interconnection layer.

Due to the multilayer interconnection construction, the interconnection layer which has previously been formed outside the power transistor-forming area can be formed inside the power transistor-forming area, and hence, enhancement of the density of integration can be achieved.

Although, in the foregoing embodiment, the semiconductor integrated circuit is formed in the surface of the P-type semiconductor substrate, it may be formed in the surface of an N-type semiconductor substrate. In this case, it is a matter of course that all the conductivity types of the impurity layers are received.

Further, although in the foregoing embodiment the insulating film interposed between the interconnection layers is the silicon dioxide film, it is not restricted thereto, and an insulating resin, PSG (phosphorus silicate glass), BSG (boron silicate glass) or the like may be used.

I claim:

1. In a semiconductor integrated circuit device which comprises at least a transistor comprising a semiconductor substrate including at least a single collector region of a first conductivity type, a plurality of base regions of a second conductivity type formed in said collector region, and emitter regions of the first conductivity type respectively formed in the base regions of the second conductivity type, the plurality of second conductivity type base regions being electrically commonly connected with one another, the plurality of first conductivity type emitter regions being electrically commonly connected with one another, a semiconductor integrated circuit device which comprises a first layer of insulating film formed on one principal surface of said semiconductor substrate, the first-layer insulating film being formed with a plurality of emitter first-layer window opening portions for exposing the greater parts of surface portions of said plurality of emitter regions on said one principal surface of said semiconductor substrate, with a plurality of base first-layer window opening portions for exposing the greater parts of surface portions of said plurality of base regions, and with a plurality of collector first-layer window opening portions for exposing the plurality of places of a surface portion of said single collector region; a first electrode interconnection layer, said interconnection layer forming a plurality of emitter first electrode layers or a single such layer respectively or commonly held in ohmic contact with said plurality of emitter regions through said plurality of emitter first-layer window opening portions, a single base first electrode interconnection layer commonly held in ohmic contact with said plurality of base regions through said plurality of base first-layer window opening portions, and a plurality of collector first electrode layers respectively held in ohmic contact with said collector region in said plurality of collector first-layer window opening portions; a second layer of insulating film formed on said first-layer insulating film and said first electrode interconnection layer, the second-layer insulating film being formed at least with a plurality of collector second-layer window opening portions for exposing at least parts of surface portions of said plurality of collector first electrode layers; and a second electrode interconnection layer, said interconnection layer forming at least a single collector second electrode interconnection layer electrically commonly connected with said plurality of collector first electrode layers through said plurality of collector second-layer window opening portions.

* * * * *